United States Patent
Tseng

[11] Patent Number: 5,904,561
[45] Date of Patent: *May 18, 1999

[54] METHOD FOR FORMING A BARRIER METAL FILM WITH CONFORMAL STEP COVERAGE IN A SEMICONDUCTOR INTERGRATED CIRCUIT

[75] Inventor: Horng-Huei Tseng, Hsinchu, Taiwan

[73] Assignee: Vanguard International Semiconductor Corporation, Hsinchu, Taiwan

[*] Notice: This patent is subject to a terminal disclaimer.

[21] Appl. No.: 08/777,609

[22] Filed: Dec. 31, 1996

Related U.S. Application Data

[63] Continuation-in-part of application No. 08/672,450, Jun. 28, 1996, Pat. No. 5,693,562.

[51] Int. Cl.$^6$ .................... H01L 21/28; H01L 21/3065
[52] U.S. Cl. .................... 438/643; 438/648; 438/669; 438/725; 438/737
[58] Field of Search .................... 438/597, 622, 438/623, 628, 629, 630, 637, 643, 648, 653, 656, 669, 671, 673, 712, 713, 627, 672, 710, 725, 737; 430/318

[56] References Cited

U.S. PATENT DOCUMENTS

| | | | |
|---|---|---|---|
| 4,822,753 | 4/1989 | Pintchovski et al. | 438/643 |
| 5,084,413 | 1/1992 | Fujita et al. | 438/675 |
| 5,427,981 | 6/1995 | Choi | 438/630 |
| 5,484,747 | 1/1996 | Chien | 438/644 |
| 5,654,233 | 8/1997 | Yu | 438/643 |
| 5,693,562 | 12/1997 | Tseng | 438/643 |
| 5,739,047 | 4/1998 | Chiang | 438/653 |

FOREIGN PATENT DOCUMENTS 1-266718  10/1989  Japan ............................ 438/FOR 360

OTHER PUBLICATIONS

Wolf, S., et al., Silicon Processing for the VLSI Era, vol. 1, 1986, Lattice Press, pp. 539–546, 564–565, 581–582.

*Primary Examiner*—T. N. Quach
*Attorney, Agent, or Firm*—Christensen O'Connor Johnson & Kindness PLLC

[57] ABSTRACT

A method for forming a barrier metal film with conformal step coverage in a semiconductor integrated circuit includes forming a photoresist plug in a barrier metal lined contact or via hole. The barrier metal film has an overhang that narrows the opening to the contact or via hole. The barrier metal film is then etched using a fluorine based plasma etch process to remove the overhang. The photoresist plug is then removed using a oxygen based plasma etch process. The contact or via hole is then filled with tungsten to form a tungsten plug.

13 Claims, 4 Drawing Sheets

METHOD FOR FORMING A BARRIER METAL FILM WITH CONFORMAL STEP COVERAGE IN A SEMICONDUCTOR INTERGRATED CIRCUIT

This application is a continuation-in-part of U.S. patent application Ser. No. 08/672,450, filed Jun. 28, 1996, U.S. Pat. No. 5,693,562.

FIELD OF THE INVENTION

The present invention relates to semiconductor integrated circuit fabrication processes and, more particularly, to methods of fabricating semiconductor integrated circuits with a barrier metal layer.

BACKGROUND OF THE INVENTION

In many semiconductor integrated circuit fabrication processes, a contact is formed to electrically connect an active region formed in a semiconductor substrate with a metal interconnect line formed on a dielectric layer disposed between the interconnect line and the substrate. In forming the contact, a contact hole is typically formed in the dielectric layer to expose the active region, with a conductive plug providing the inter-layer conductive path from the active region to the interconnect line. A barrier layer is commonly formed between the active region and the conductive plug formed in the contact hole. The barrier layer helps reduce interdiffusion of metal from the conductive plug and silicon from the active region, which typically occurs through a silicide formed on the upper surface of the active region. Ideally, this barrier layer adheres to both the silicide and the metal, prevents interdiffusion, and covers the contact hole in a uniform conformal manner.

In practice, the stepped character of the contact hole prevents the uniform conformal formation of the barrier layer within the contact hole. One reason for this problem is that the barrier layer is typically formed by noncollimated sputter deposition. As is well known in the art of integrated circuit fabrication, the relatively high aspect ratio of a typical contact hole causes poor step coverage for noncollimated sputter deposition. Generally, as the aspect ratio increases, the step coverage worsens. In addition, the poor step coverage usually results in "overhang" that undesirably narrows the opening of the contact hole (described below in conjunction with FIG. 1). Conventional solutions to this problem include reducing the slope of the step or the thickness of barrier metal film. However, these solutions are not optimal because reducing the slope increases the area the contact occupies and reducing the thickness of the barrier layer also reduces the effectiveness of the barrier layer in preventing interdiffusion.

FIG. 1 shows a cross-sectional view of a stage in the conventional fabrication of a barrier layer in a contact hole. A dielectric layer 14 is formed on top of a substrate 10 having a conductive area 12. The conductive area 12 can be a source/drain region or gate electrode of a metal oxide semiconductor (MOS) transistor. The term MOS is used herein to also refer to silicon gate technologies. The dielectric layer 14 can be an oxide or a borophosphosilicate glass (BPSG) that is deposited on the substrate 10 in any suitable manner.

A contact hole 17 is then formed in the dielectric layer 14 using any suitable technique. For example, conventional patterning and etching processes can be performed to pattern the dielectric layer 14 and form the contact hole 17 aligned with the conductive area 12. As a result, a portion of the conductive area 12 is exposed. The contact hole 17 typically has a relatively high aspect ratio of about two or higher.

A barrier metal layer or film 16 is then formed on the dielectric layer 14 and in the contact hole 17. As stated above, the barrier metal layer 16 is typically formed by noncollimated sputter deposition. In this example, the barrier metal is a stack of titanium and titanium nitride (i.e., Ti/TiN). In other embodiments, other metal stack structures can be used such as, for example, W/AlSiCu/TiN. The Ti/TiN barrier layer has a thickness in the range about 300 Å–500 Å for the Ti and about 1300 Å–1500 Å for the TiN.

As shown in FIG. 1, the opening of contact hole 17 has an overhang profile. The overhang 15 undesirably narrows the opening of the contact hole 17, which in effect increases the aspect ratio of the contact hole 17. Then, tungsten 18 is deposited over the barrier layer and into the contact hole 17. Because of the narrow opening and the shape of the contact hole 17, the tungsten does not completely fill the contact hole 17 as shown in FIG. 1A. As a result, the tungsten plug is thin, which causes the tungsten plug to have a relatively high resistance. Of course, high resistance is generally undesirable in a contact.

SUMMARY OF THE INVENTION

In accordance with the present invention, a method for forming a barrier metal layer with conformal step coverage in a semiconductor integrated circuit is provided. In one embodiment, the method comprises forming a dielectric layer on a bottom layer with a conductive area therein. The dielectric layer is then patterned and etched to form a hole exposing the conductive area. A barrier metal layer or film is then formed on the dielectric layer and within the hole.

A photoresist layer is then formed over the barrier metal layer so as to substantially fill the hole. An upper portion of the photoresist layer is then removed, leaving a lower portion of the photoresist layer within the hole. The upper surface of the lower portion of the photoresist layer is below any overhang in the barrier metal layer at the opening of the hole. The barrier metal layer is then etched, thereby removing the overhang. The barrier metal layer at the bottom of the hole is protected from the etching by the lower portion of the photoresist remaining in the hole.

The lower portion of the photoresist layer is then removed. Consequently, unlike the conventional process, the barrier metal layer is substantially uniform in thickness within the hole, which results in a relatively wide opening and, thus, a relatively small aspect ratio. Then a conductive layer is formed over the barrier metal layer. In contrast to the conventional process, the conductive layer can substantially fill the hole. The conductive layer is then etched, thereby forming a conductive plug within the hole. Because the conductive plug substantially fills the hole, the resistance of the conductive plug is much lower than the conductive plug formed in the aforementioned conventional process.

BRIEF DESCRIPTION OF THE DRAWINGS

The foregoing aspects and many of the attendant advantages of this invention will become more readily appreciated as the same becomes better understood by reference to the following detailed description, when taken in conjunction with the accompanying drawings, wherein.

DETAILED DESCRIPTION OF THE PREFERRED EMBODIMENT

The method of forming a barrier metal layer with conformal step coverage described herein include some process procedures that are well known in the art of semiconductor integrated circuit fabrication and, thus, need not be described in detail. For example, the various photolithographic and etching processes for patterning a layer are very well known and, therefore, the various steps of these processes are omitted.

Figure 1:
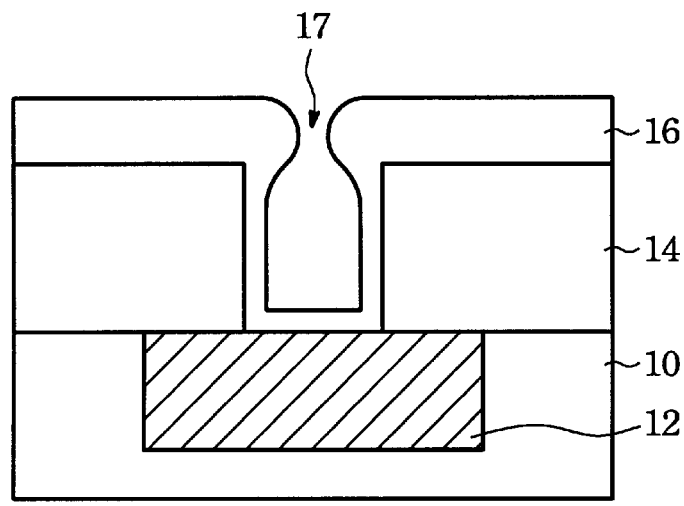
FIGS 1 and 1A are cross-sectional views of a semiconductor wafer illustratig a conventional method for fabricating a contact.
Figure 1A:
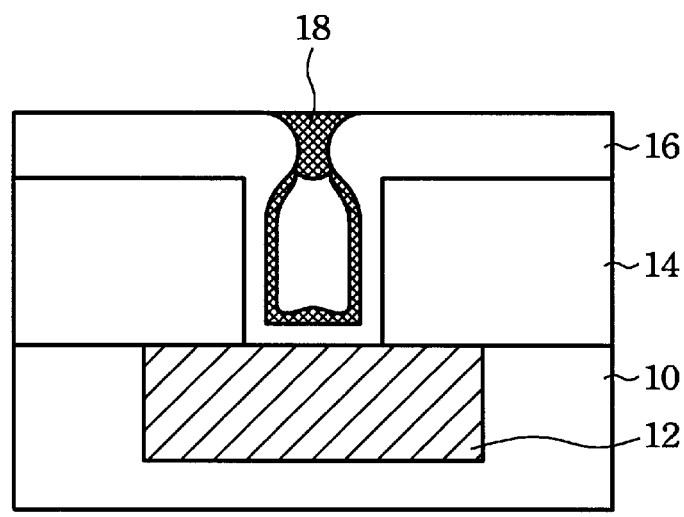

In accordance with one embodiment of the present invention, the structure shown in FIG. 1 is formed using any suitable process. The dielectric layer 14 has a thickness of about 6000 Å. The contact hole 17 has a width of about 3000 Å and a depth substantially equal to the thickness of the dielectric layer 14 (i.e., about 6000 Å).

Figure 2:
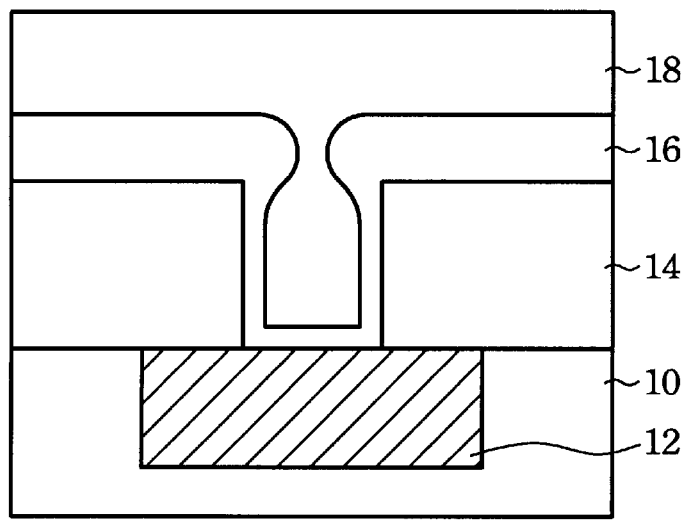
FIGS. 2–6 are cross-sectional views of a semiconductor wafer illustrating various stages of forming an inter-layer interconnect according to one embodiment of the present invention.

Then, as shown in FIG. 2, a photoresist layer 18 is formed on the barrier metal film 16. Because typical photoresist material is liquid, some photoresist will flow into the contact hole 17 and substantially fill up the contact hole 17 despite the narrow opening and high aspect ratio caused by the overhang 15A.

Figure 3:
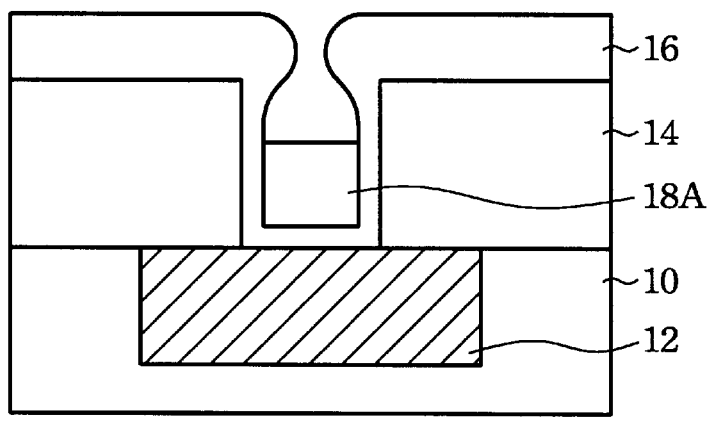

FIG. 3 illustrates a next stage of one embodiment of the present invention. The photoresist layer 18 is etched back by using a plasma etching. In the preferred embodiment, a reactive ion etching (RIE) or a magnetic enhanced reactive ion etching (MERIE) is used for this process. The etchant of the etching is preferably composed of $O_2$ and $CF_4$. The plasma etching only attacks the photoresist layer 18 and by controlling the etching time and gas flow rate, only the upper portion of the photoresist layer 18 is removed. The lower portion of the photoresist layer 18 is not exposed. As a result, in this embodiment, the lower portion of the photoresist layer 18 has a thickness of about 4000–6000 Å. The upper portion of the photoresist layer 18 is then removed in any suitable manner, leaving the lower portion 18A of the photoresist in the contact hole 17, but well below the overhang 15A of the barrier metal layer 16. The resulting structure is shown in FIG. 3.

Figure 4:
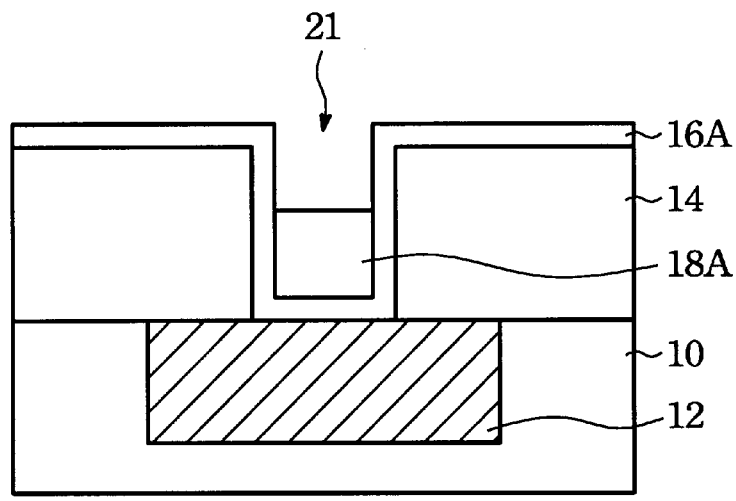

Referring now to FIG. 4, the barrier metal layer 16 (FIG. 3) is then etched. In this embodiment, the etching is performed using a chlorine-based and fluorine-based plasma etching process with an etching gas such as $CCl_4$, $BCl_3$ or $CF_4$, which is indicated by an arrow 21. These plasma etching processes are relatively highly selective for the barrier metal layer 16 and relatively nonselective for the remaining lower portion 18A of the photoresist layer. Thus, the upper portion of the barrier metal layer 16 including the overhang 15A is removed, leaving the lower portion 16A of the barrier metal film with a thickness of about 1200–1500 Å. The resulting structure, including the remaining lower portion of the barrier metal film 16A, is shown in FIG. 4.

Figure 5:
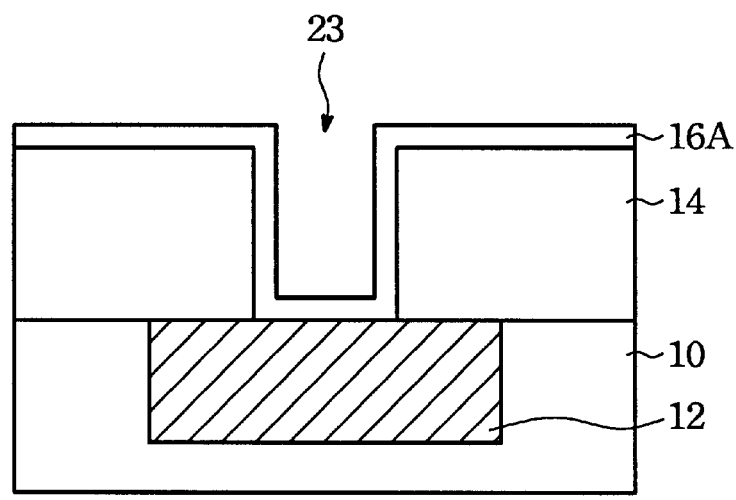

FIG. 5 shows a cross-sectional view of a next stage of one embodiment of the process. The lower portion 18A of the photoresist layer is removed using any suitable process. In this embodiment, the lower portion 18A is removed using a conventional oxygen gas plasma process, indicated by an arrow 23. The oxygen plasma is relatively highly selective for the photoresist portion 18A and relatively nonselective for the barrier metal film 16A. Thus, the barrier metal film now substantially conformally coats the dielectric layer 14 and the interior of the contact hole 17.

An optional step used in an alternative embodiment of the present invention. In this alternative embodiment, a second barrier metal film is formed on the barrier metal film 16A (FIG. 5), thereby forming a relatively thick barrier metal layer 26. This embodiment is advantageously used when the barrier metal film 16A is not thick enough (FIG. 4). For example, if the thickness of barrier metal film 16A is below about 1000 Å, the barrier metal film is susceptible to failure. Then this embodiment can be used to increase the thickness of the barrier metal layer to an acceptable level. Typically, the thickness of the second barrier metal film needed to bring the total thickness of the barrier metal layer to an acceptable level is very small. Thus, the second barrier film deposition typically has good step coverage with relatively no overhang.

Figure 6:
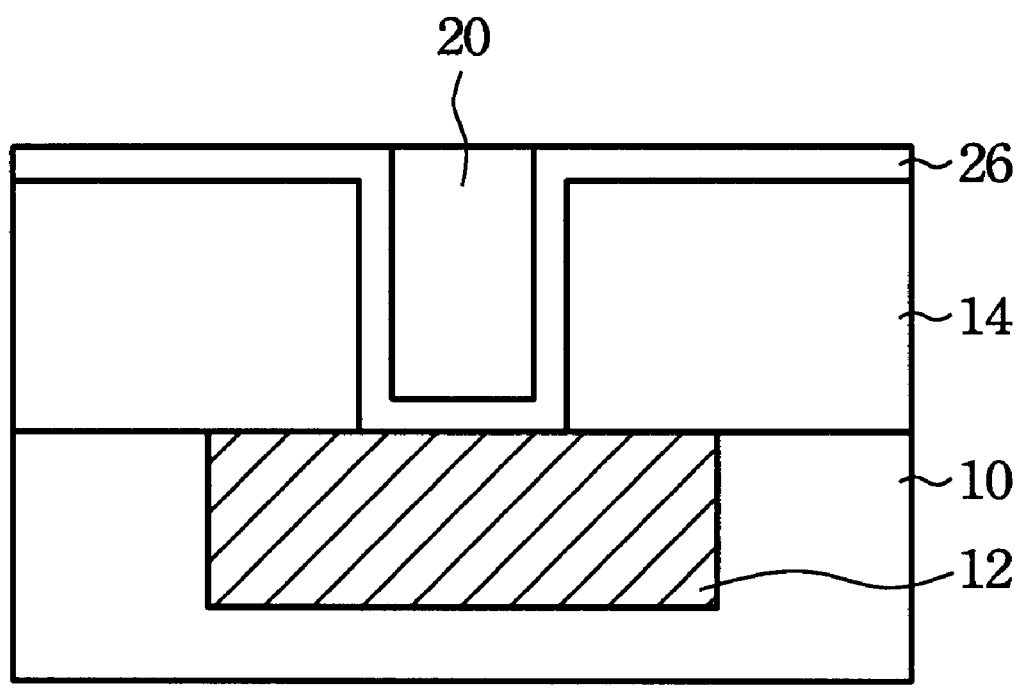

FIG. 6 illustrates one of the final stages of one embodiment of the process. A tungsten layer is formed on the barrier metal layer 26 so that tungsten fills the contact hole 25. Unlike the aforementioned conventional process, the barrier metal layer has substantially no overhang, thereby allowing the tungsten to substantially completely fill the contact hole. The tungsten layer is then etched back so that a tungsten plug 20 is formed in the contact hole 25. As a result, the tungsten plug 20 has low resistance when compared to the tungsten plug formed in the conventional process.

The embodiments described above are illustrative the principles of the present invention and are not intended to limit the invention to the particular embodiments described. For example, while in the above embodiments the barrier metal layer is formed in a contact hole, other embodiments can be used to provide a conformal barrier metal layer for conductive areas that are not on a substrate. Thus, in an alternative embodiment, a conformal barrier metal layer is formed in a via hole. Accordingly, while the preferred embodiment of the invention has been illustrated and described, it will be appreciated that in view of this disclosure, various changes can be made by those skilled in the art of integrated circuit fabrication without departing from the spirit and scope of the invention.

The embodiments of the invention in which an exclusive property or privilege is claimed are defined as follows:

1. A method for forming a barrier metal film, said method comprising:

depositing a dielectric layer on a bottom layer, said bottom layer having a conductive area, said dielectric layer covering said conductive area;

forming a hole through said dielectric layer to uncover at least a portion of said conductive area;

forming a barrier metal layer over said dielectric layer and in said hole, said barrier metal layer lining said hole and contacting said conductive area, wherein said barrier metal layer has an overhang formed on the upper portion of said hole;

forming a photoresist layer on said barrier metal layer so that said photoresist layer substantially completely fills said hole;

removing an upper portion of said photoresist layer by using plasma etching to form a photoresist plug in said hole such that said photoresist plug fills said hole below said overhang;

etching said barrier metal layer such that said overhang is substantially removed; and removing the photoresist plug in the hole.

2. The method according to claim 1, further comprising depositing a second barrier metal film on said barrier metal layer after removing said photoresist plug.

3. The method according to claim 1 wherein said hole is a contact hole.

4. The method according to claim 1, wherein said hole is a via hole.

5. The method according to claim 1, wherein said barrier metal layer comprises a Ti/TiN stack.

6. The method according to claim 5, wherein said Ti/TiN stack comprises a Ti layer having a thickness of about 300 Å–500 Å and a TiN layer having a thickness of about 1300 Å–1500 Å.

7. The method according to claim 1, wherein etching said barrier metal layer comprises etching by using a chlorine-based and fluorine-based plasma etching process.

8. The method according to claim 7, wherein said fluorine-based plasma etching process comprises using $CF_4$ vapor.

9. The method according to claim 7, wherein said chlorine-based plasma etching process comprises using $CCl_4$ and $BCl_3$.

10. The method according to claim 1, wherein the etchant used for removing the upper portion of said photoresist is composed of $CF_4$ and $O_2$.

11. The method according to claim 10, wherein the upper portion of said photoresist is removed by reactive ion etching.

12. The method according to claim 10, wherein the upper portion of said photoresist is removed by magnetic enhanced reactive ion etching.

13. The method according to claim 1, wherein removing said photoresist plug comprises etching by using an oxygen-based plasma etching process.

* * * * *

UNITED STATES PATENT AND TRADEMARK OFFICE
CERTIFICATE OF CORRECTION

PATENT NO. : 5,904,561
DATED : May 18, 1999
INVENTOR(S) : H.-H. Tseng

It is certified that error appears in the above-identified patent and that said Letters Patent is hereby corrected as shown below:

| COLUMN | LINE | |
|---|---|---|
| [54] | Title | "INTERGRATED" should read --INTEGRATED-- |
| col. 1 | line 4 | |
| 1 | 4 | "INTERGRATED" should read --INTEGRATED-- |

Signed and Sealed this

Fifth Day of October, 1999

Attest:

Q. TODD DICKINSON

*Attesting Officer*      *Acting Commissioner of Patents and Trademarks*